United States Patent [19]

Trift et al.

[11] Patent Number: 4,768,006
[45] Date of Patent: Aug. 30, 1988

[54] ELECTTRICAL AND MECHANICAL COUPLING FOR COUPLING A MICROWAVE CASE BOTH TO ITS SOURCE AND TO ITS SUPPORT, AND A METHOD OF USING SUCH A COUPLING

[75] Inventors: Olivier Trift, Tremblay Les Gonesse; Alain Multon, Asnieres, both of France

[73] Assignee: Alcatel Thomson Faisceaux Hertziens, Levallois Perret Cedex, France

[21] Appl. No.: 31,724

[22] Filed: Mar. 30, 1987

[30] Foreign Application Priority Data

Mar. 28, 1986 [FR] France ............................ 86 04515

[51] Int. Cl.[4] ........................ H01P 1/00; H01P 5/00
[52] U.S. Cl. .................... 333/255; 285/311; 285/312
[58] Field of Search ............... 333/254, 255; 285/24, 285/27, 226, 311, 312, 320

[56] References Cited

U.S. PATENT DOCUMENTS 2,256,845  9/1941  Lanninger ................. 285/312 X
2,643,139  6/1953  Hamilton ................... 333/255 X
2,928,059  3/1960  Chamberlain .
3,383,633  5/1968  Havlicsek .
4,002,955  1/1977  Eggert .

FOREIGN PATENT DOCUMENTS 0128686  12/1984  European Pat. Off. .
1061870  7/1959  Netherlands .

Primary Examiner—Paul Gensler
Attorney, Agent, or Firm—Sughrue, Mion, Zinn, Macpeak, and Seas

[57] ABSTRACT

An electrical and mechanical coupling for coupling a microwave head case both to its source and to its support including a back stop and source-positioning pegs. A toggle fastener system is mounted on one of its faces with the toggle fastener system including a draw-bar, a fixing portion, and an operating lever. A blade-shaped return spring has one end fixed to the support and is situated so as to enable the draw-bar to rest on the free end of the spring when the operating lever is pushed back. The source includes structure for engaging said source-positioning pegs, a flexible metal waveguide, a special flange disposed on a free end face of the flexible waveguide and having an opening therethrough and two centering pegs disposed on the special flange. A damper is disposed between the special flange and the body of the source. The microwave head case includes an assembly flange on a first face thereof. The assembly flange includes an opening for co-operating with said opening through the special flange. Two peg-receiving orifices are associated with the assembly flange to receive the respective centering pegs and a second face includes a hook and a back stop, respectively for engagement with the draw-bar and the backstop of the support, respectively.

11 Claims, 3 Drawing Sheets

ELECTTRICAL AND MECHANICAL COUPLING FOR COUPLING A MICROWAVE CASE BOTH TO ITS SOURCE AND TO ITS SUPPORT, AND A METHOD OF USING SUCH A COUPLING

The invention relates to an electrical and mechanical coupling for coupling a microwave case to its source and to its support, and also to a method of using such a coupling.

BACKGROUND OF THE INVENTION

In prior art devices, mechanical fixing is performed separately from electrical fixing. Mechanical fixing is provided by means of a plurality of bolts requiring the operator to manipulate a corresponding number of nuts.

Similarly, a centering screw is required for the electrical fixing and again the operator must perform several manipulations.

The present invention seeks to mitigate these drawbacks by simplifying the manipulations required to a considerable extent.

The invention can be used to establish a microwave electrical connection between a microwave head and its source, while simultaneously providing triaxial mechanical connection between said microwave head and its support.

These two connections are obtained by means of a toggle fastener device which can be operated by a single movement.

SUMMARY OF THE INVENTION

The present invention provides a coupling for electrical coupling a microwave case to its source and for mechanically coupling said case to its support.

The support includes:
a back stop;
source-positioning pegs;
a toggle fastener system on one of its faces, said toggle fastener system including a draw-bar, a fixing portion, and an operating lever; and
a blade-shaped return spring having one end fixed to the support and situated so as to enable the draw-bar to rest on the free end of the spring when the operating lever is pushed back.

The source includes:
means for engaging said source-positioning pegs;
a flexible metal waveguide;
a special flange disposed on a free end face of the flexible waveguide and having an opening therethrough;
two centering pegs disposed on the special flange; and
a damper disposed between the special flange and the body of the source.

The microwave head includes:
an assembly flange on a first face thereof, said assembly flange including an opening for co-operating with said opening through the special flange;
two peg-receiving orifices associated with said assembly flange to receive said centering pegs; and
a second face includes a hook and a back stop respectively suitable for co-operating with the draw-bar and the backstop of the support.

More precisely, the invention provides a coupling in which the flexible guide is situated in the extension of the rigid guides, said guides being rectangular, and the special flange and the assembly flange having respective rectangular openings therethrough.

Advantageously, the invention provides a coupling in which the toggle fastening system is oriented at an angle lying between 20° and 45° to the direction of the return spring, with the two back stops being dovetailed in shape, with the free end of the return spring having a flared U-shape, with the damper being a layer of cellular foam, and with the return spring being a blade of beryllium bronze.

The invention also provides a method wherein locking takes place in the following stages:
the source is fixed to the support;
the microwave head is placed on the support so as to put the two flanges face to face, with the end of the hook then being placed above the flared U-shaped end of the return spring;
the lever of the toggle fastener system is maneuvered so as to slide its draw-bar along the return spring in a first direction; and
the lever is then maneuvered in a second direction opposite to the first.

BRIEF DESCRIPTION OF THE DRAWINGS

An embodiment of the invention is described by way of example with reference to the accompanying drawings, in which.

MORE DETAILED DESCRIPTION

Figure 1:
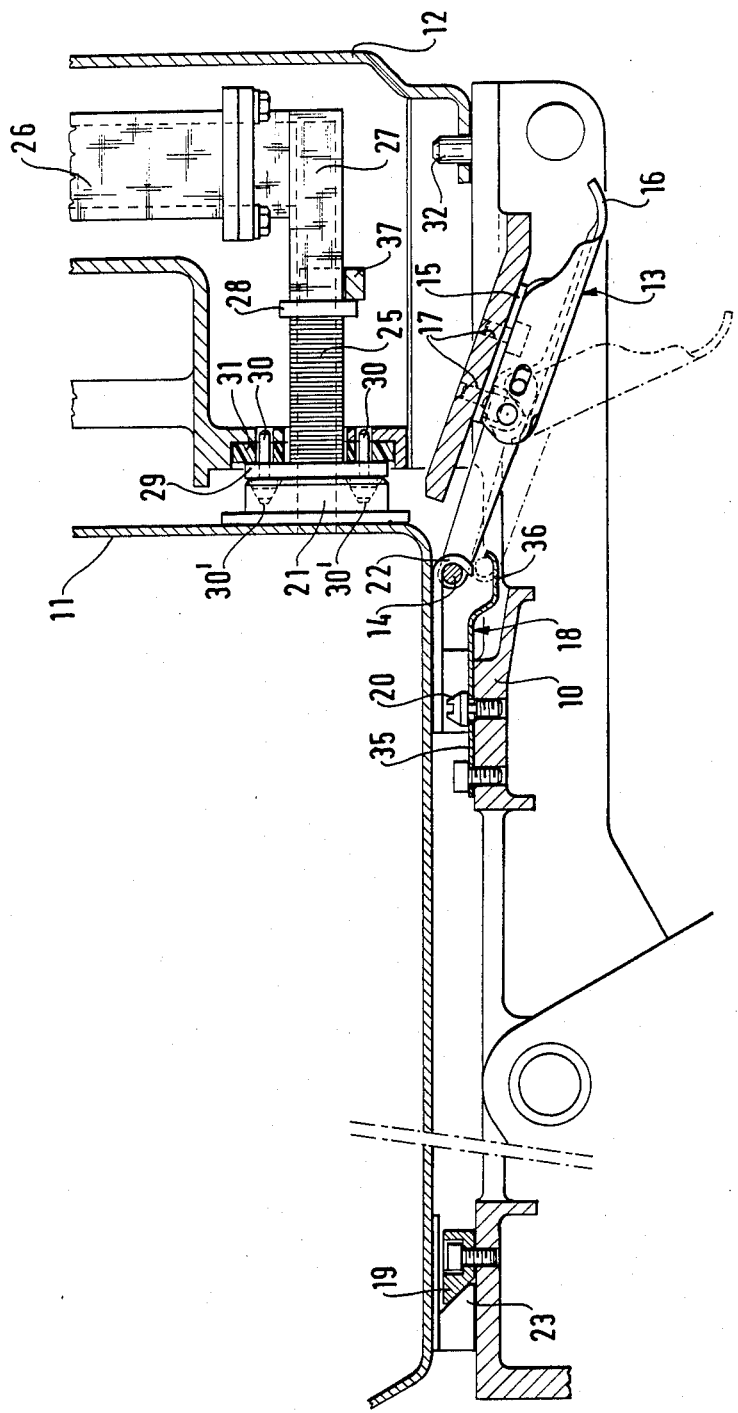
FIG. 1 shows a coupling in accordance with the invention at rest and in the locked position.

A coupling in accordance with the invention comprises three portions:
a mechanical base or support 10;
a microwave head case 11; and
a microwave source envelope 12.

The mechanical base 10 supports:
a toggle fastener system 13 comprising three components: a draw-bar 14, a fixing portion 15, and an operating lever 16; said fastener system 13 being fixed to the body of the mechanical base 10 by means of fixing screws 17;
a return spring 18 and a return spring position adjusting screw 20;
a back stop 19 which is dovetailed in shape; and
source-positioning pegs 32.

The microwave head 11 comprises:
an assembly flange 21 having two orifices 30';
a hook 22; and
a moving back stop 23 which is dovetailed in shape.

The source envelope 12 supports:
a flexible metal waveguide 25 situated as the extension of two rigid waveguides 26 and 27, with the second rigid waveguide 27 terminating in a flange 28;
a special flange 29 fixed to the end of the flexible waveguide 25 and provided with two centering pegs 30;
a damper 31 disposed between the special flange 29 and the body of the source envelope 12; and
a stop 37 against which the flange 28 is pressed, thereby enabling the rigid waveguides 26 and 27 to be maintained in a fixed position.

The rigid waveguides and the flexible waveguide 25 are rectangular waveguides. The return spring 18 is in the form of a blade having one end 35 fixed to the mechanical base 10, and having its other end 36 disposed in a flared U-shape.

In the position where the various elements are all locked together, i.e. where the base 10, the microwave head case 11, and the source envelope 12 are locked together as shown in FIG. 1, the spring blade 18 situated beneath the microwave head case 11 lies parallel to the central portion of the hook 22 and the toggle fastener 13 forms an angle of about 30° with said direction. This angle may lie, for example, in the range 20° to 45°.

In said locked position, the source envelope 12 and the microwave head case 11 are located on the same side of the support 10, one in front of the other, such that their respective flanges 21 and 29 (both having rectangular openings therethrough) have their rectangular openings disposed in alignment, with the two centering pegs 30 being disposed in two orifices 30' drilled in the assembly flange 21.

The source envelope 12 is held in position by means of positioning pegs 32, while the microwave head is held in position by means of the toggle fastener 13.

Figure 2:
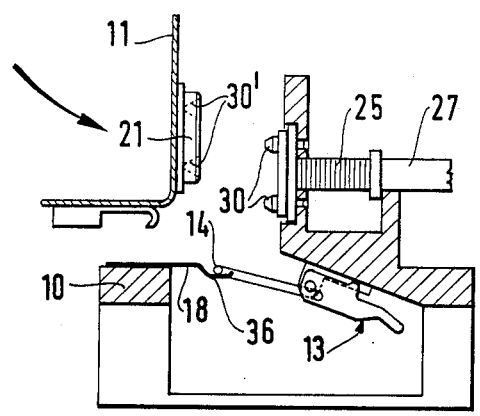
FIGS. 2 to 6 show various stages during the locking of a coupling in accordance with the invention.

The various stages in locking or coupling items using a coupling in accordance with the invention are as follows:

As shown in FIG. 2, the source envelope is initially fixed to the mechanical base 10 with the draw-bar 14 of the toggle fastener 13 resting in the flared U-shaped hollow 36 of the spring blade 18.

Figure 3:
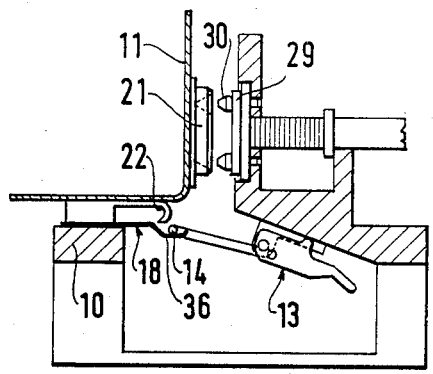

As shown in FIG. 3, the case of the microwave head case 11 is then placed on the mechanical base 10 so as to bring the two flanges 21 and 29 face to face, with the end of the hook 22 then lying over the flared U-shaped end 36 of the return spring 18.

Figure 4:
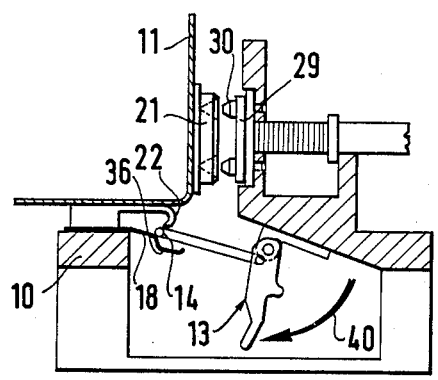
Figure 5:
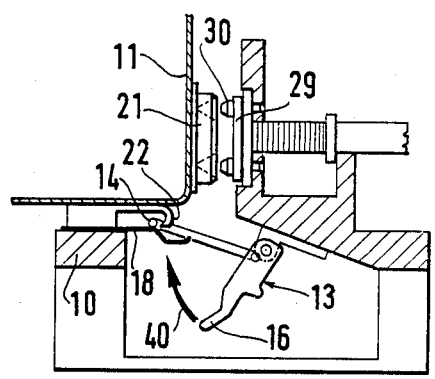

As shown in FIG. 4, the toggle fastener lever 16 is then moved in direction 40 causing the spring blade 18 to move out of the way to allow the draw-bar 14 of the fastener 13 to be held captive by the hook 22, as shown in FIG. 5.

Figure 6:
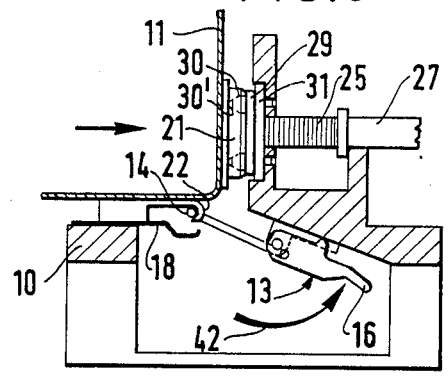

As shown in FIG. 6, the lever 16 of the fastener 13 is then moved in the opposite direction 42. This draws the microwave head case 11 so that its assembly flange 21 comes into contact with the special flange 29, with the centering pegs 30 penetrating into the corresponding orifices 30'.

The flexible waveguide 25 and the damper 31 are then pressed together until the moving back stop 23 engages the stationary back stop 19.

As shown in FIG. 6, the various items are firmly coupled together both from the mechanical point of view and from the electrical point of view, in particular by virtue of the flexible waveguide 25 and the damper 31. The assembled apparatus is then insensitive to vibration.

Figure 7:
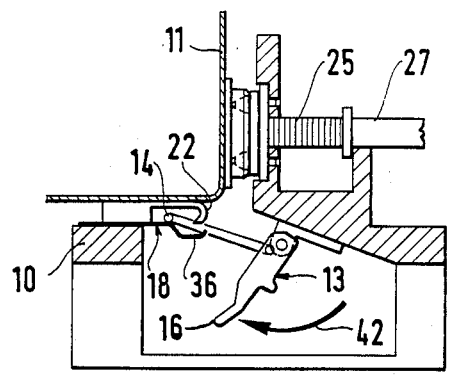
FIGS. 7 to 9 show various stages during the unlocking of a coupling in accordance with the invention.

When unlocking or uncoupling a coupling in accordance with the invention, as shown in FIG. 7, the lever 16 of the toggle fastening 13 is initially moved in direction 42 until its draw-bar 14 has moved beyond the end of the hook 22.

Figure 8:
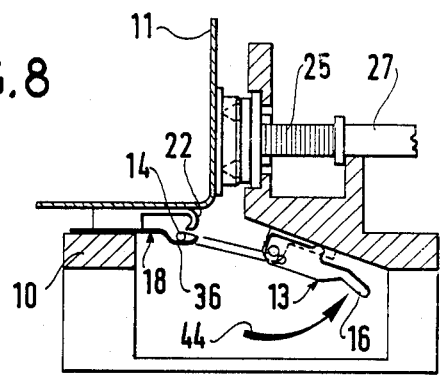

By virtue of the shape of the hook 22 and the shape of the end 36 of the return spring 18, when the lever 16 is moved in the opposite direction, the fastener draw-bar 14 escapes from the hook 22, as shown in FIG. 8.

Figure 9:
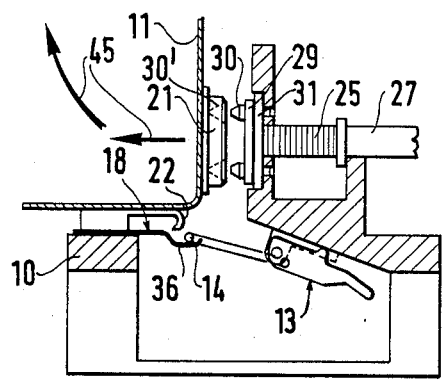

By virtue of the resilience of the flexible guide 25 and of the damper 31, the microwave head case 11 is pushed away from the source envelope 12, as shown in FIG. 9.

The microwave head case 11 can then be removed from the mechanical base 10 (arrow 45).

The microwave head case 11 is thus locked and unlocked relative to the assembly comprising the mechanical base 10 and the source envelope 12 solely by operating the lever 16 of the toggle fastener in one direction and then in the opposite direction. Coupling is provided by the fastener 13 locking to the hook 22 provided on the microwave case 11. The electrical connection is provided in a single movement by the special flange 29 being pressed against the assembly flange 21 on the microwave case 11, and being centered relative thereto by the centering pegs 30.

Contact flexibility is provided by the flexible waveguide 25 which serves to absorb the compression due to the assembly force. The stop 37 limits displacement of and holds the rigid portion of the waveguide. The flexible portion of the assembly returns to its initial position, during uncoupling with assistance from the damper 31 mounted on the source envelope 12. Such damper-waveguide assembly flexibility helps absorb tolerances in all directions between the various parts which are brought together.

Precise electrical coupling is provided between the outlet interface from the microwave head case 11 and the waveguide by means of the two centering pegs 30 on the source-side flange 29. Optimum grounding contact is made possible by the geometrical fit obtained when the flexible waveguide 29 is urged by the coupling force against the case 11.

Mechanical connection and locking of the microwave head case 11 on its support 10 is thus provided by the toggle fastener 13 providing a downwardly directed traction force of about 4 to 5 kgf (kilograms-force).

The dovetail-shaped back stop 23 and the centering pegs 30 enable the case 11 to be accurately positioned relative to the source, thereby avoiding any degree of freedom.

The toggle fastener 13 provides a reversible effect. When it is opened, its hook abuts against the front shoe of the case and is guided by the spring blade 18, thereby allowing the assembly to be electrically and mechanically de-coupled.

The mechanical connection of the microwave case on its cast support 10 via the toggle fastener is provided by the dovetail assembly 23, 19.

The return spring 18 ensures that the draw-bar of the toggle fastener is capable of returning. This spring is fixed by two screws, with one of the screws, namely the screw 20, determining a degree of additional freedom for the microwave case.

When unlocking the assembly, the fastener draw-bar 14 is guided in its displacement so as to escape from the centering parts (parts 30 and 20).

The two pegs 32 serve to position the source assembly on the casting and to center the source relative to the microwave case.

The damper 31 may be a cellular foam having an open network of cells in order to take up mechanical slack. In order to ensure that it is capable of returning to its original position after being compressed, its hardness may lie in the range, for example, of 40 to 60 points on the Shore scale.

The spring blade 18 must be flexible and may be made of beryllium bronze.

The coupling described above satisfies the following requirements:

SWR (standing-wave ratio) of 1.15, loss <0.3 db;

withstands vibration both from the mechanical point of view and from the microwave connection point of view;

no loss of contact between the coupling flanges is observed by virtue of the flexibility obtained using the flexible waveguide and its associated damper; and the connection is reliable over a temperature range of −40° C. to +60° C.

Naturally, the present invention is defined by the claims and is broader than the specific embodiment described above.

We claim:

1. An electrical and mechanical coupling for electrically coupling a microwave head case to its microwave source and mechanically to its support,
    wherein the support includes:
    a fixed back stop;
    source-positioning pegs;
    a toggle fastener system mounted on one face of said support, said toggle fastener system including a draw-bar, a fixing portion, and an operating lever; and
    a blade-shaped return spring having one end fixed to the support and having a free end, and being situated so as to enable the draw-bar to rest on the free end of the spring when the operating lever is pushed back;
    wherein the microwave source includes a body:
    means for engaging said source-positioning pegs to locate said source body relative to said support;
    a flexible metal waveguide having a free end face;
    a special flange disposed on the free end face of the flexible waveguide and having an opening therethrough;
    two centering pegs disposed on the special flange and projecting towards said case; and
    a damper disposed between the special flange and the body of the source; and
    wherein the microwave head case includes:
    an assembly flange on a first face thereof facing said special flange of said free end face of said flexible waveguide, said assembly flange including an opening for alignment with said opening through the special flange;
    said assembly flange including two peg-receiving orifices aligned with said centering pegs, respectively to receive said centering pegs; and
    a second face including a hook positioned to engage the draw-bar and a moving backstop engageable with the fixed backstop of the support.

2. A coupling according to claim 1, wherein the flexible waveguide constitutes an extension of rigid waveguides.

3. A coupling according to claim 2, wherein the waveguides are rectangular waveguides.

4. A coupling according to claim 1, wherein the special flange and the assembly flange are both provided with rectangular openings.

5. A coupling according to claim 1, wherein the toggle fastener system is oriented at an angle lying in the range 20° to 45° relative to the direction of the return spring.

6. A coupling according to claim 1, wherein the two back stops are dovetailed in shape.

7. A coupling according to claim 1, wherein the free end of the return spring is of flared U-shape.

8. A coupling according to claim 1, wherein the damper is a layer of cellular foam.

9. A coupling according to claim 1, wherein the return spring is a blade of beryllium bronze.

10. A method of effecting an electrical coupling between a microwave head case and a microwave source and a mechanical coupling between said microwave head case and a support, wherein the support includes a fixed backstop, source-positioning pegs; a toggle fastener system mounted on one face of said support, said toggle fastener system including a draw-bar, a fixing portion and an operating lever; and a blade-shaped return spring having one end fixed to the support and having a free end, and being situated so as to enable the draw-bar to rest on the free end of the spring when the operating lever is pushed back; wherein the microwave source includes a body; means for engaging said source-positioning pegs to locate said source body relative to said support; a flexible metal waveguide having a free end face; a special flange disposed on the free end face of the flexible waveguide and having an opening therethrough; two centering pegs disposed on the special flange and projecting towards said case; and a damper disposed between the special flange and the body of the source; an wherein the microwave head case includes: an assembly flange on a first face thereof facing said special flange of said free end face of said flexible waveguide, said assembly flange including an opening for alignment with said opening through the special flange; said assembly flange including two peg-receiving orifices and aligned with said centering pegs, respectively, to receive said centering pegs; and a second face including a hook positioned to engage the draw-bar and a moving backstop engageable with the fixed back stop of the support, and wherein locking takes place in accordance with the following stages:
    the source is fixed to the support;
    the microwave head is placed on the support so as to place the two flanges face to face, with the end of the hook then being placed above a flared U-shaped end of the return spring;
    the lever of the toggle fastener system is maneuvered so as to slide its draw-bar along the return spring in a first direction; and
    the lever is then maneuvered in a second direction opposite to the first, thereby causing the spring blade to move out of the way to allow the draw-bar of the fastener to be held captive by the hook, and wherein during maneuvering of the lever in a second direction opposite to the first, the microwave head case moves so that said assembly flange contacts the special flange thereby effecting penetration of the centering pegs into corresponding peg-receiving orifices of said assembly flange.

11. A method according to claim 10, wherein during successive unlocking stages the lever of the toggle fastener system is maneuvered in a first direction so as to clear the end of the hook, and wherein during movement in the opposite direction, by virtue of the shape of the hook and the shape of the end of the return spring, the fastener draw-bar escapes from the hook, and wherein, by virtue of the resilience of the flexible waveguide and the damper, the microwave head case is pushed away from the source allowing the microwave head case to be mechanically removed from the base support.

* * * * *